United States Patent
Yoo et al.

(10) Patent No.: US 7,501,664 B2
(45) Date of Patent: Mar. 10, 2009

(54) III-NITRIDE COMPOUND SEMICONDUCTOR LIGHT EMITTING DEVICE

(75) Inventors: Tae Kyung Yoo, Kyunggi-do (KR); Eun Hyun Park, Kyunggi-do (KR)

(73) Assignee: Epivalley Co., Ltd., Koomi (KR)

( * ) Notice: Subject to any disclaimer, the term of this patent is extended or adjusted under 35 U.S.C. 154(b) by 288 days.

(21) Appl. No.: 10/597,617

(22) PCT Filed: Feb. 5, 2005

(86) PCT No.: PCT/KR2005/000361

§ 371 (c)(1),
(2), (4) Date: Aug. 25, 2006

(87) PCT Pub. No.: WO2005/078813

PCT Pub. Date: Aug. 25, 2005

(65) Prior Publication Data

US 2008/0149918 A1    Jun. 26, 2008

(30) Foreign Application Priority Data

Feb. 13, 2004 (KR) ............. 10-2004-0009529

(51) Int. Cl.
*H01L 33/00* (2006.01)
(52) U.S. Cl. .................... 257/96; 257/190
(58) Field of Classification Search ......... 257/96, 257/98, 14, 190
See application file for complete search history.

(56) References Cited

U.S. PATENT DOCUMENTS 6,455,870 B1    9/2002   Wang et al.
7,193,246 B1 *  3/2007   Tanizawa et al. ........... 257/94
2001/0009134 A1 7/2001  Kim et al.
2002/0179923 A1 12/2002 Morita et al.
2005/0157765 A1 7/2005  Johnson

FOREIGN PATENT DOCUMENTS

| JP | 9-83016 | 3/1997 |
|---|---|---|
| JP | 9-9139543 | 5/1997 |
| JP | 9-266327 | 10/1997 |
| JP | 11-074622 | 3/1999 |
| JP | 2003150315 | 5/2003 |
| KR | 1020010077971 | 8/2001 |
| KR | 1020040047132 | 6/2004 |
| WO | WO-99/46822 | 9/1999 |
| WO | WO-2005034253 | 4/2005 |

* cited by examiner

Primary Examiner—Mark Prenty
(74) Attorney, Agent, or Firm—Darby & Darby P.C.

(57) ABSTRACT

The present invention provides a III-nitride compound semiconductor light emitting device comprising an active layer (30) which emits light and is interposed between a lower contact layer (20) made of n-GaN and an upper contact layer (40) made of p-GaN, in which a sequential stack of a lattice mismatch-reducing layer L3 made of $In_xGa_{1-x}N$, an electron supply layer L4 made of n-GaN or $n\text{-}Al_yGa_{1-y}N$ and a crystal restoration layer L5 made of $In_zGa_{1-z}N$ is interposed between the lower contact layer and the active layer, and further comprising an electron acceleration layer L1 made of n-GaN or undoped GaN and a heterojunction electron barrier-removing layer L2, thereby the lattice mismatch between the lower contact layer (20) and the active layer (30) can be reduced.

25 Claims, 6 Drawing Sheets

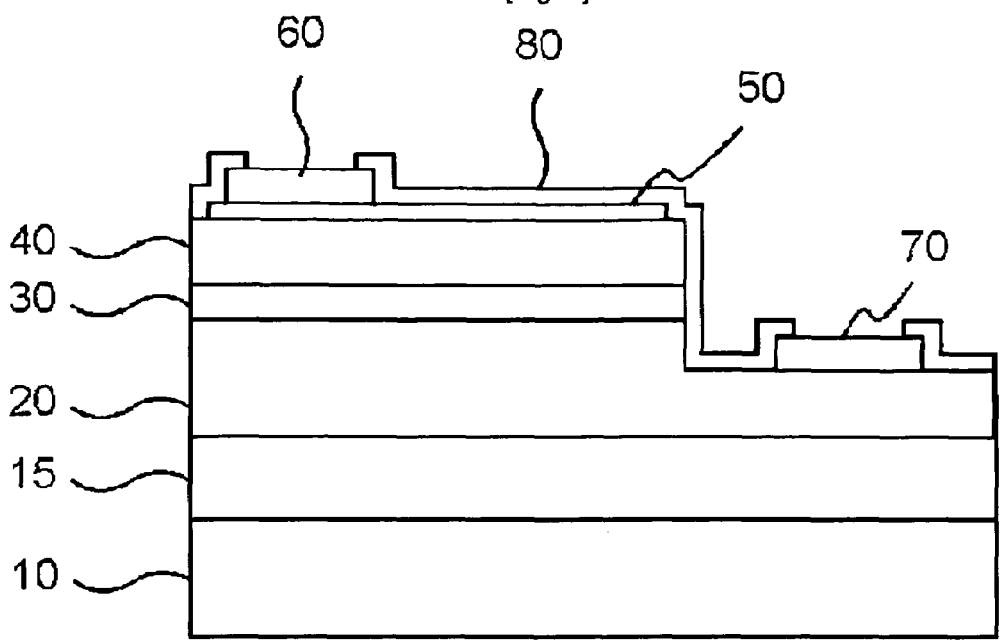
[Fig. 1]
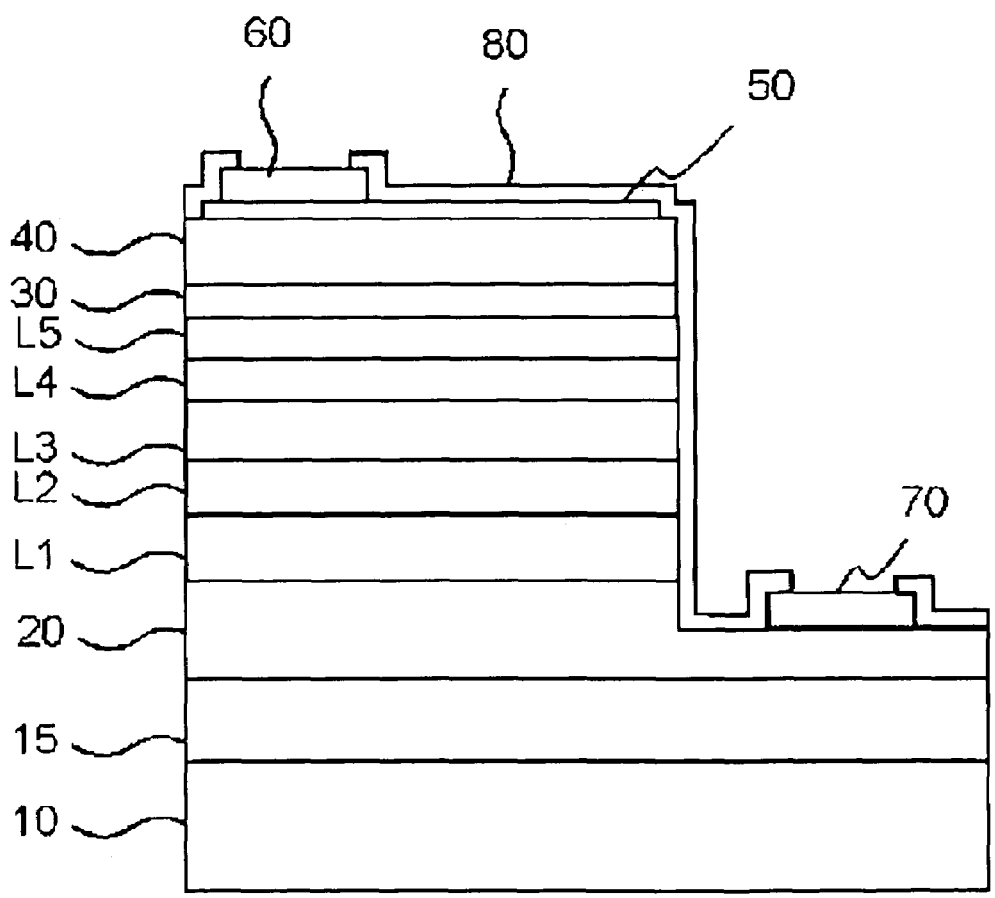
[Fig. 2]

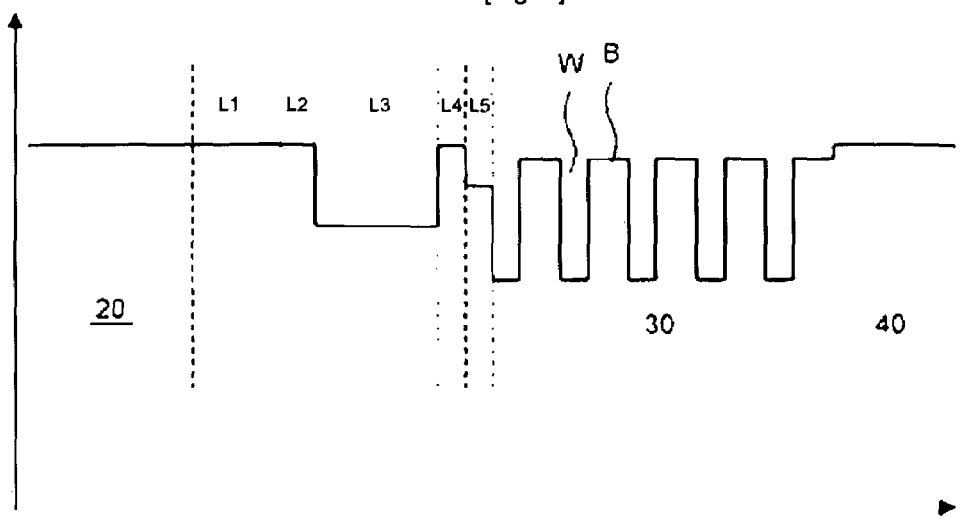
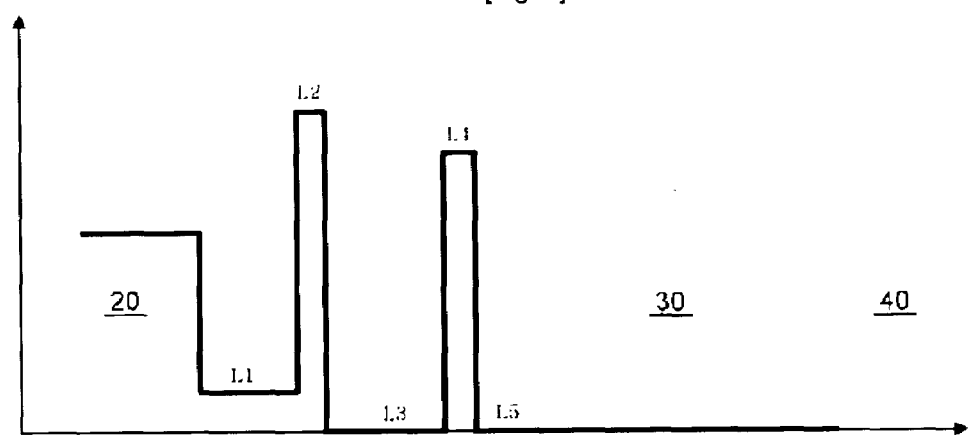

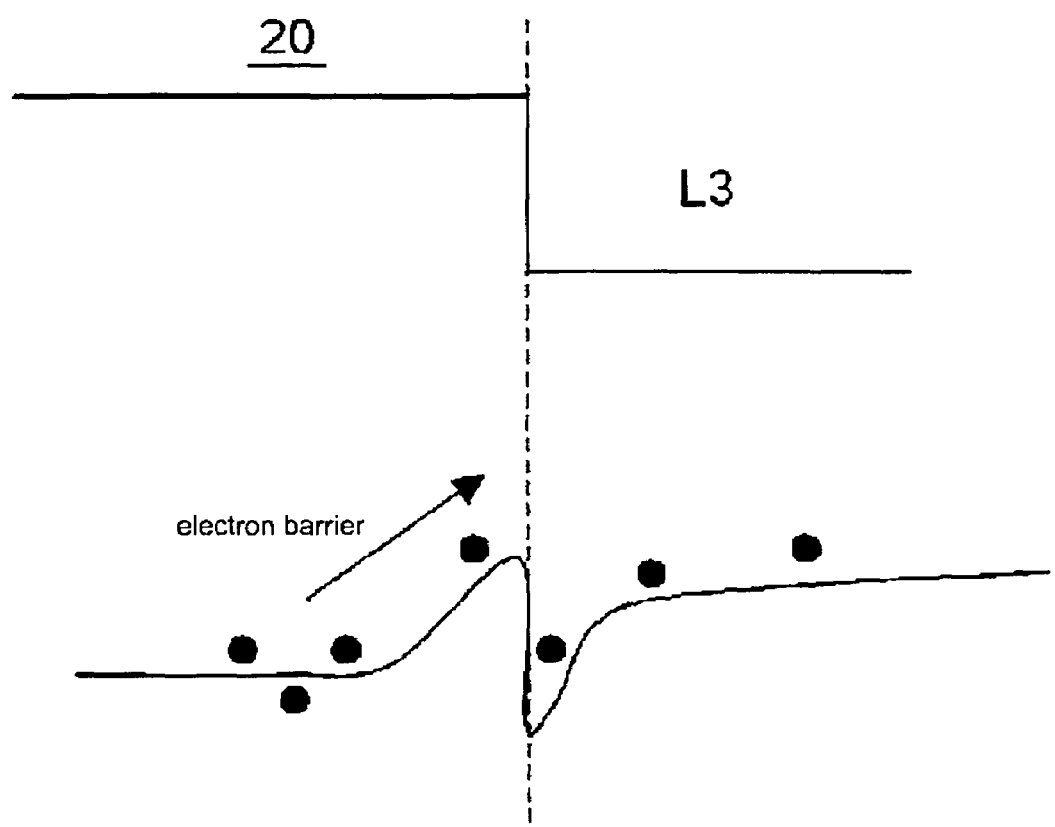

[Fig. 6]
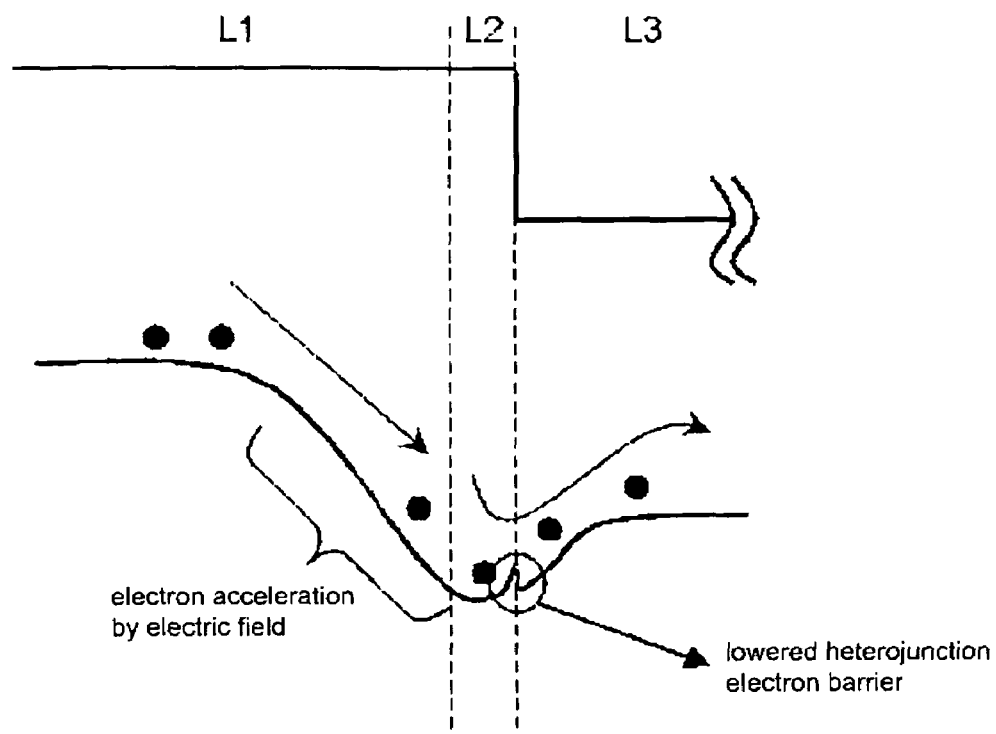
[Fig. 7]
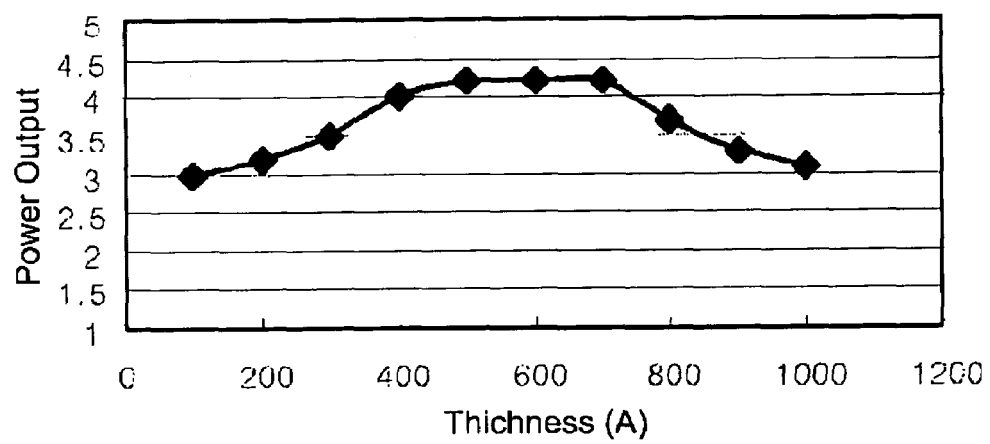

[Fig. 8]
at 470nm, thickness: 500A, L4: 5x10$^{18}$
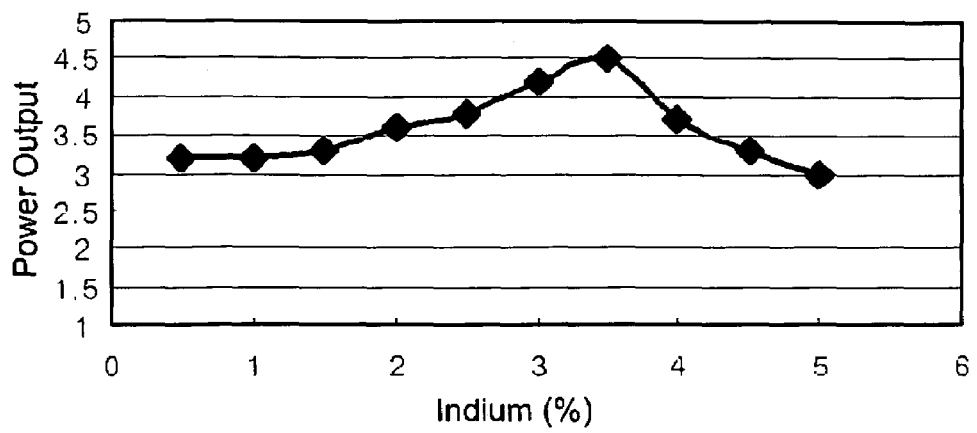
[Fig. 9]
at 470nm, L3: 300A, In: 3%
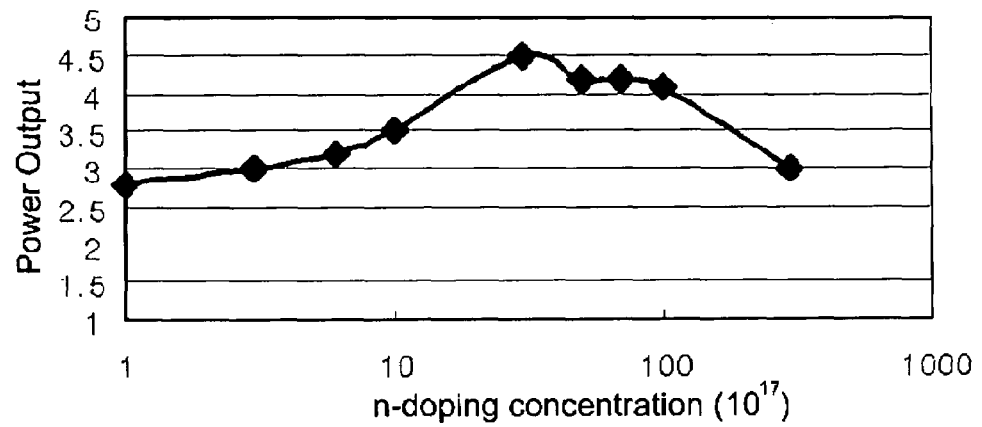

[Fig. 10]
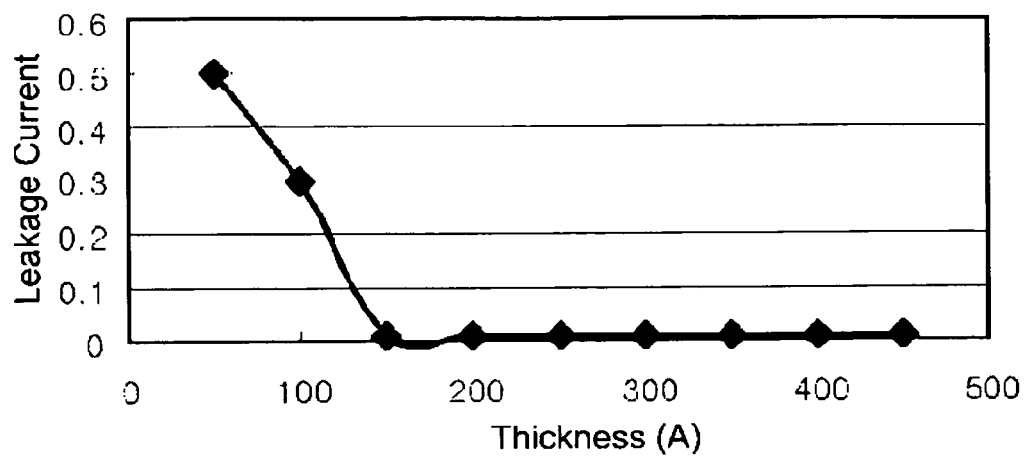
[Fig. 11]
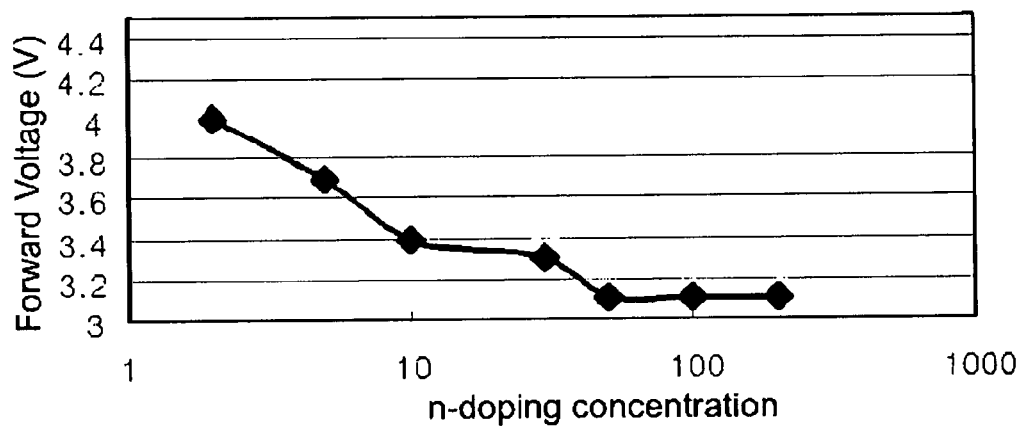

III-NITRIDE COMPOUND SEMICONDUCTOR LIGHT EMITTING DEVICE

TECHNICAL FIELD

The present invention relates to a III-nitride compound semiconductor light emitting device, and more particularly, to a III-nitride compound semiconductor light emitting device in which the lattice mismatch between an active layer and a lower contact layer made of n-GaN can be reduced and a reduction in thin film quality caused by the doping of an n-type dopant can be prevented.

BACKGROUND ART

FIG. 1 is a cross-sectional view for illustrating a III-nitride compound semi-conductor light emitting device according to the prior art.

Referring to FIG. 1, the prior III-nitride compound semiconductor light emitting device is fabricated in the following manner. The buffer layer 15 made of undoped GaN, the lower contact layer 20 made of n-GaN, the active layer 30 with a single-quantum-well structure or a multiple-quantum-well structure, and the upper contact layer 40 made of p-GaN, are sequentially deposited on the sapphire substrate 20. Then, mesa etching is performed in such a way to expose the lower contact layer 20. After the electrode layers 50, 60 and 70 to be used as electrodes are formed, the passivation film 80 is formed.

The multiple-quantum-well structure of the active layer 30 is composed of an alternate stack of quantum well layers and quantum barrier layers, in which the quantum well layers may be made of InGaN, and the quantum barrier layers may be InGaN or GaN. It is understood that, if all the quantum well layers and the quantum barrier layers are made of InGaN, the amount of indium (In) in the quantum barrier layers will be lower than the amount of indium in the quantum well layers.

The above-described prior III-nitride compound semiconductor light emitting device has a problem in that the lattice mismatch between the lower contact layer 20 and the active layer 30 is very large. The longer the wavelength of light to be emitted becomes, the larger the lattice mismatch becomes, thus making it more difficult to grow the active layer 30 with high quality. The III-nitride compound semiconductor has the property of piezoelectrics, which becomes stronger as the lattice mismatch becomes larger. Particularly, when the piezoelectric phenomenon occurs within the active layer 30, a change of the energy band shape of the active layer 30 will be caused, resulting in the distortion of the wave functions of holes and electrons, thus reducing light emitting efficiency in the active layer 30.

Meanwhile, as the concentration of n-type dopants (e.g., silicon) in the III-nitride compound semiconductor becomes higher, the thin film quality of the III nitride compound semiconductor layer is deteriorated, and because of its influence, a thin film layer deposited thereon will also be deteriorated in quality. As a result, as the doping concentration of the lower contact layer 20 becomes higher, the thin film quality of the active layer adjacent thereto will be deteriorated, resulting in reductions in the thin film quality of the active layer and the reliability of a device.

As described above, in the prior III-nitride compound semiconductor light emitting device, there are the problem of the lattice mismatch between the lower contact layer 20 and the active layer 30, and the problem of a reduction in the qualities of the lower contact layer 20 and the active layer 30, which is caused by n-type doping to the lower contact layer 20.

DISCLOSURE OF INVENTION

Technical Problem

Accordingly, it is an object of the present invention to provide a III-nitride compound semiconductor light emitting device in which electrons can be effectively supplied to the active layer 30, and at the same time, the mismatch between the lower contact layer 20 and the active layer 30 can be reduced, and a reduction in the quality of the lower contact layer 20 and a thin film formed thereon, which is caused by n-type doping to the lower contact layer 20, can be prevented.

Technical Solution

To achieve the above object, the present invention provides a III-nitride compound semiconductor light emitting device comprising an active layer which emits light and is interposed between a lower contact layer made of n-GaN and an upper contact layer made of p-GaN, in which a sequential stack of a lattice mismatch-reducing layer made of $In_xGa_{1-x}N$, an electron supply layer made of n-GaN or n-$Al_yGa_{1-y}N$ and a crystal restoration layer made of $In_zGa_{1-z}N$ is interposed between the lower contact layer and the active layer.

The active layer may have a single-quantum-well or multiple-quantum-well structure comprising quantum well layer made of $In_xGa_{1-x}N$.

The active layer may have a multiple-quantum structure composed of an alternate stacking of quantum well layers and quantum barrier layers, in which the lattice mismatch-reducing layer preferably has an energy band gap larger than the energy band gap of the quantum well layers and smaller than the energy band gap of the quantum barrier layers.

The lattice mismatch-reducing layer preferably has a thickness of 10-1000 Å.

The lattice mismatch-reducing layer is preferably undoped.

The indium content of the lattice mismatch-reducing layer is preferably $0<x\leq0.4$.

The Al content of the electron supply layer is preferably $0<y\leq0.2$.

The electron supply layer preferably has a thickness of 10-500 Å.

The doping concentration of the electron supply layer is preferably $5\times10^{17}$-$10\times10^{21}$ atoms/cm$^3$.

The active layer may have a multiple-quantum-well structure composed of an alternate stacking of quantum well layers and quantum barrier layers, in which the crystal restoration layer preferably has an energy band gap larger than the energy band gap of the quantum well layers and smaller than the energy bandgap of the quantum barrier layers.

The crystal restoration layer preferably has a thickness of 10-500 Å.

The crystal restoration layer is preferably undoped.

The indium content of the crystal restoration layer is preferably $0<z\leq0.4$.

Between the lower contact layer and the lattice mismatch-reducing layer, a sequential stack of an electron acceleration layer made of n-GaN or undoped GaN and a heterojunction electron barrier-removing layer made of a higher doping concentration of n-GaN than that of the electron acceleration layer may be interposed.

When the electron acceleration layer is made of n-GaN, the doping concentration of the electron acceleration layer is preferably $1\times10^{15}$-$1\times10^{18}$ atoms/cm$^3$.

The electron acceleration layer preferably has a thickness of 100-10000 Å.

The doping concentration of the heterojunction electron barrier-removing layer is preferably $1\times10^{18}$-$1\times10^{21}$ atoms/cm$^3$.

The heterojunction electron barrier-removing layer preferably has a thickness of 10-300 Å.

The heterojunction electron barrier-removing layer may be a delta-doping layer.

Meanwhile, the heterojunction electron barrier-removing layer may also be composed of an alternate stack in a superlattice form of a first layer made of n-GaN having a higher doping concentration than that of the electron acceleration layer and a second layer made of undoped GaN or n-GaN having a lower doping concentration than that of the first layer. In this case, the doping concentration of the first layer is preferably $1\times10^{18}$-$1\times10^{21}$ atoms/cm$^3$. Furthermore, the thickness of each of the first and second layer is preferably 5-150 Å and the thickness of the heterojunction electron barrier-removing layer is preferably 20-500 Å.

Advantageous Effects

According to the present invention as described above, electrons can be effectively supplied to the active layer 30, and at the same time, the lattice mismatch between the lower contact layer 20 and the active layer 30 can be reduced and a reduction in the quality of the lower contact layer 20 and a thin film formed thereon, which occurs due to n-type doping to the lower contact layer 20, can be prevented.

BRIEF DESCRIPTION OF THE DRAWINGS

FIG. 1 is a cross-sectional view illustrating the prior III-nitride compound semi-conductor light emitting device.

FIG. 2 is a cross-sectional view illustrating a III-nitride compound semiconductor light emitting device according to an embodiment of the present invention.

FIG. 3 is the energy-band diagram of the conduction band of each layer of the light emitting device shown in FIG. 2.

FIG. 4 is a graph showing the concentration of n-type dopant silicon in each of the layers shown in FIG. 2.

FIG. 5 is a heterojunction energy-band diagram in the case the lower contact layer 20 is in a direct contact with the lattice mismatch-reducing layer L3.

FIG. 6 is an energy-band diagram illustrating the roles of the electron acceleration layer L1 and the heterojunction electron barrier-removing layer L2.

FIG. 7 is a graph showing light output as a function of the thickness of the lattice mismatch-reducing layer L3.

FIG. 8 is a graph showing light output as a function of the indium of the lattice mismatch-reducing layer L3.

FIG. 9 is a graph showing light output as a function of the doping concentration of the electron supply layer L4.

FIG. 10 is a graph showing leakage current as a function of the thickness of the crystal restoration layer L5.

FIG. 11 is a graph showing forward driving voltage as a function of the doping concentration of the heterojunction electron barrier-removing layer L2.

MODE FOR THE INVENTION

Hereinafter, the present invention will be described in detail with reference to the accompanying drawings. In the drawings, the same reference numerals as those in FIG. 1 represent elements performing the same functions, and a duplicate description thereof will be omitted.

The following embodiments are provided for a better understanding of the present invention and it will be obvious to any person skilled in the art that many modifications to these embodiments can be made within technical concept of the present invention. Accordingly, it should not be construed that the scope of the present invention is not limited to or by these embodiments.

FIG. 2 is a cross-sectional view illustrating a III-nitride compound semiconductor light emitting device according to an embodiment of the present invention.

Referring to FIG. 2, between the lower contact layer 20 and the active layer 30, the lattice mismatch-reducing layer L3 made of undoped $In_xGa_{1-x}N$ to reduce strain caused by lattice mismatch is interposed. On the lattice mismatch-reducing layer L3, the electron supply layer L4 made of n-$Al_yGa_{1-y}N$ to effectively supply electrons to the active layer 30 is deposited. On the electron supply layer L4, the crystal restoration layer L5 made of undoped $In_zGa_{1-z}N$ to restore the quality of the electron supply layer L4 whose quality has been deteriorated due to doping is deposited. Thus, the active layer 30 is adjacent to the crystal restoration layer L5.

If necessary, in order to improve the operating properties of the inventive device having the lattice mismatch-reducing layer L3, a sequential stack of the electrode acceleration layer L1 made of n-GaN or undoped GaN and the heterojunction electron battier layer L2 made of n-GaN may also be interposed between the lower contact layer 20 and the lattice mismatch-reducing layer-reducing layer L3.

FIG. 3 is the energy-band diagram of the conduction band of each layer of the device shown in FIG. 2, which was schematically plotted on the basis of the composition of the layer without considering the doping concentration of the layer. And, FIG. 4 shows the concentration of n-type dopant silicon in each of the layers shown in FIG. 2.

Referring to FIGS. 3 and 4, the lattice mismatch-reducing layer L3 and the crystal restoration layer L5 has an energy band gap larger than the energy band gap of the quantum well layers W and smaller than the energy band gap of the quantum barrier layer B. However, this does not means that the lattice mismatch-reducing layer L3 and the crystal restoration layer L5 should have energy band gaps of the same size. The energy band gaps of the lattice mismatch-reducing layer L3 and the crystal restoration layer L5 vary depending on the amount of indium and become smaller as the amount of indium increases. The indium content of the crystal restoration layer L5 is preferably $0<z\leqq0.4$.

When the lattice mismatch-reducing layer L3 and the crystal restoration layer L5 are doped, there will be a high possibility that their quality is deteriorated, thus causing problems in the reliability and light emitting efficiency of the device. For this reason, it is preferable that the lattice mismatch-reducing layer L3 and the crystal restoration layer L5 should not be intentionally doped.

In the present invention, the electron supply layer L4 whose quality has been deteriorated due to n-type doping is not directly adjacent to the active layer 30, but the crystal restoration layer L5 with no doping and thus with good quality is adjacent to the active layer 30. This allows the active layer 30 to be obtained with high quality, resulting in an increase in the light emitting efficiency of the active layer 30. FIG. 10 is a graph showing leakage current as a function of the thickness of the crystal restoration layer L5. As can be seen in FIG. 10, the thickness of the crystal restoration layer is preferably 10-500 Å and more preferably 150-500 Å.

If the lattice mismatch-reducing layer L3 is excessively thick, there will be a problem in that the series resistance of the device is increased, leading to an increase in the driving voltage of the device, because the layer L3 has not been intentionally doped. On the other hand, if the lattice mismatch-reducing layer L3 is excessively thin, there will be a problem in reducing the lattice mismatch between the lower contact layer 20 and the active layer 30. For these reason, the lattice mismatch-reducing layer L3 preferably has a thickness of 10-1000 Å.

Test results for a change in the light output of the light emitting device with a change in the thickness of the lattice mismatch-reducing layer L3 are shown in FIG. 7. These results were obtained at a light emitting wavelength around 470 nm for the case where the lattice mismatch-reducing layer L3 has an indium content of 3%. As can be seen in FIG. 7, the light emitting device shows the highest light output when the lattice mismatch-reducing layer L3 has a thickness of 500-700 Å at which the brightness is improved to a maximum of 50% as compared to the case out of this optimum thickness range.

FIG. 8 shows light output as a function of the indium content of the lattice mismatch-reducing layer L3 when the thickness of the layer L3 is 500 Å. As can be seen in FIG. 8, the light emitting device shows the highest light emitting efficiency at an indium content of about 3-4%.

The thickness and indium content of the lattice mismatch-reducing layer L3 may have a variety of combinations depending on the degree of lattice mismatch between the lower contact layer 20 and the active layer 30. As the bandgap of the active layer 30 becomes smaller, it is preferred that the thickness and indium content of the lattice mismatch-reducing layer L3 have larger values.

Although the introduction of the lattice mismatch-reducing layer L3 can provide the effect of improving the thin film properties of the active layer 30 by minimizing the lattice mismatch between the lower contact layer 20 and the active layer 30, it will cause the following two problems.

First, since the lattice mismatch-reducing layer L3 has poor electrical conductivity because it has not been intentionally doped, electrons will feel a difficulty in migration from the lower contact layer 20 to the active layer 30. In other words, the number of electrons injected into the active layer 30 will be decreased, leading to a reduction in light emitting efficiency.

Second, since the lattice mismatch-reducing layer L3 contains indium, the contact surface between the lattice mismatch-reducing layer L3 and the lower contact layer 20 below thereof will show heterojunction properties. Due to the heterojunction, an electron energy barrier will be formed on the contact surface, so that the flow of electrons from the lower contact layer 20 to the active layer 30 will be obstructed. This will lead to an increase in driving voltage.

To solve the first problem, the electron supply layer L4 made of n-$Al_yGa_{1-y}N$ is formed on the lattice mismatch-reducing layer L3.

The concentration of the n-type dopant in the electron supply layer L4 is preferably $5\times10^{17}$-$1\times10^{21}$ atoms/cm$^3$, and the thickness of the electron supply layer L4 is preferably 10-500 Å. And the Al content of the layer L4 is preferably $0\leq y\leq 0.2$. The more the amount of Al becomes, the larger the bandgap becomes, and the lattice mismatch-reducing layer L3 and the crystal restoration layer L5, which are disposed above and below the electron supply layer L4, respectively, are all made of InGaN. Thus, in order to minimize the inconsistency between these two layers and the electron supply layer L4 in electron conduction band, the band gap of the electron supply layer L4 is limited to equal or greater value than the bandgap of GaN as described above.

The introduction of the electron supply layer L4 is for solving the interference of electron supply to the active layer 13, which results from the introduction of the lattice mismatch-reducing layer L3, thereby improvements in light output and driving voltage are achieved.

FIG. 9 is a graph showing light output characteristics as a function of the doping concentration of the electron supply layer L4. As shown in FIG. 9, at low doping concentration, the light output shows a tendency to decrease rapidly, which is a phenomenon resulting from insufficient electron supply caused by the lattice mismatch-reducing layer L3. It can be seen that the light output becomes optimal when the doping concentration of the electron supply layer L4 is about $5\times10^{18}$. At excessively high doping concentration, the light output shows a tendency to decrease, which seems to be a phenomenon occurring because a deterioration in thin film caused by excessive doping influences the active layer 30.

Meanwhile, in order to solve the second problem, the heterojunction electron barrier-removing layer L2 made of highly doped n-GaN is formed below the lattice mismatch-reducing layer L3. The heterojunction electron barrier layer L2 is a delta doping layer having a higher doping concentration than that of the electron acceleration layer L1, which serves to remove an electron barrier caused by the heterojunction between the lower contact layer 20 and the lattice mismatch-reducing layer.

The electron barrier by the heterojunction causes a problem in that it interferes with the flow of electrons from the lower contact layer 20 to the active layer 30, leading to a great increase in the driving voltage of the device. This problem becomes more serious as the indium content of the lattice mismatch L3 increases.

The heterojunction electron barrier-removing layer L2 preferably has a doping concentration of $1\times10^{18}$-$1\times10^{21}$ atoms/cm$^3$, and a thickness of 10-300 Å. The heterojunction electron barrier-removing layer L2 should be very thin, and this thin thickness can be achieved by delta doping. This is because if the heterojunction electron barrier-removing layer L2 is thick, its quality will be deteriorated to make the properties of the thin film formed thereon poor, thus-deteriorating the performance of the device.

If necessary, the heterojunction electron barrier-removing layer L2 may also consist of an alternate stack in a superlattice form of a first layer made of n-GaN having a higher doping concentration than that of the electron acceleration layer L1 and a second layer made of GaN or n-GaN having a lower doping concentration than that of the first layer. In this case, the doping concentration of the first layers is preferably $1\times10^{18}$-$1\times10^{21}$ atoms/cm$^3$. And, the thickness of each of the first and second layer is preferably 5-150 Å and the thickness of the heterojunction electron barrier-removing layer is preferably 20-500 Å. The construction of this supperlattice form has an advantage in that it can improve the sensitivity of driving voltage to the thickness of the electron barrier-removing layer.

FIG. 11 is a graph showing forward driving voltage at 20 mA as a function of the doping concentration of the heterojunction electron barrier-removing layer L2. As can be seen in FIG. 11, at low doping concentration, the driving voltage increases up to 4V, and depending on the doping concentration, the driving voltage decreases up to 3.1 V. For reference, the forward driving voltage of the nitride compound semiconductor light emitting device, which is currently needed, is generally equal to or below 3.5 V at 20 mA.

In order to increase the role of the heterojunction electron barrier-removing layer L2, the electron acceleration layer L1 made of low concentration n-GaN or intentionally undoped GaN is preferably disposed below the heterojunction electron barrier-removing layer L2.

FIG. 5 is an energy band diagram for the case where the lower contact layer 20 and the lattice mismatch-reducing layer L3 are in direct contact with each other. From FIG. 5, it can be seen that electrons are difficult to pass to the lattice mismatch-reducing layer L3, due to the presence of the electron barrier resulting from the heterojunction.

FIG. 6 is an energy band diagram illustrating the roles of the electron acceleration layer L1 and the heterojunction electron barrier-reducing layer L2. As can be seen in FIG. 6, the energy band will be bent downward due to a difference in doping concentration between the electron acceleration layer L1 and the heterojunction electron barrier-removing layer L2. Thus; the electric field will occur in the opposite direction to the arrow, and by this electric field, electrons will be accelerated toward the heterojunction electron barrier-removing layer L2. Moreover, by the heterojunction electron barrier-removing layer L2 having a high doping concentration, the height and width of the electron barrier caused by heterojunction will be reduced. This, by such two effects, electrons will be easily passed through the heterojunction electron barrier, resulting in a significant reduction in the driving voltage of the device.

For nitride compound semiconductors, at high n-type doping concentration, the thin film quality shows a tendency to decrease rapidly. For this reason, it is preferable that the electron acceleration layer L1 should not be intentionally doped or should be doped at a low concentration. when the electron acceleration layer L1 is doped, it will preferably have a doping concentration of $1\times10^{15}$-$1\times10^{18}$ atoms/cm$^3$ and a thickness of 10-10000 Å.

The invention claimed is:

1. A III-nitride compound semiconductor light emitting device comprising:
    an active layer emitting light and being interposed between a lower contact layer made of n-GaN and an upper contact layer made of p-type III-nitride compound semiconductor layer, the active layer having at least one quantum well layer and one quantum barrier layer in contact with the quantum well layer,
    an n-type electrode layer formed on the lower contact layer,
    a lattice mismatch-reducing layer made of $In_xGa_{1-x}N$ (x>0), grown on the lower contact layer and having a thickness of 200-1000 Å, the lattice mismatch-reducing layer having an energy band gap larger than the energy band gap of the quantum well layer and smaller than the energy band gap of the quantum barrier layer,
    an electron supply layer made of n-$Al_yGa_{1-y}N(y\geqq0)$ and grown on the lattice mismatch-reducing layer, and
    a crystal restoration layer made of $In_zGa_{1-z}N(z>0)$, grown on the electron supply layer and in contact with the active layer.

2. The III-nitride compound semiconductor light emitting device of claim 1, wherein the active layer has a single-quantum-well or multiple-quantum-well structure comprising quantum well layer made of $In_xGa_{1-x}N$.

3. The III-nitride compound semiconductor light emitting device of claim 1, wherein the lattice mismatch-reducing layer is undoped.

4. The III-nitride compound semiconductor light emitting device of claim 1, wherein the indium content of the lattice mismatch-reducing layer is $0<x\leqq0.4$.

5. The III-nitride compound semiconductor light emitting device of claim 1, wherein the Al content of the electron supply layer is $0<y\leqq0.2$.

6. The III-nitride compound semiconductor light emitting device of claim 1, wherein the electron supply layer has a thickness of 10-500 Å.

7. The III-nitride compound semiconductor light emitting device of claim 1, wherein the doping concentration of the electron supply layer is $5\times10^{17}$-$10\times10^{21}$ atoms/cm$^3$.

8. The III-nitride compound semiconductor light emitting device of claim 1, wherein the crystal restoration layer has an energy band gap larger than the energy band gap of the quantum well layer and smaller than the energy bandgap of the quantum barrier layer.

9. The III-nitride compound semiconductor light emitting device of claim 1, wherein the crystal restoration layer has a thickness of 10-500 Å.

10. The III-nitride compound semiconductor light emitting device of claim 1, wherein the crystal restoration layer is undoped.

11. The III-nitride compound semiconductor light emitting device of claim 1, wherein the indium content of the crystal restoration layer is $0<z\leqq0.4$.

12. A III-nitride compound semiconductor light emitting device comprising:
    an active layer emitting light and being interposed between a lower contact layer made of n-GaN and an upper contact layer made of p-type III-nitride compound semiconductor layer,
    an n-type electrode layer formed on the lower contact layer,
    a lattice mismatch-reducing layer made of $In_xGa_{1-x}N$ (x>0), grown on the lower contact layer and having a thickness of 200-1000 Å,
    an electron supply layer made of n-$Al_yGa_{1-y}N(y\geqq0)$ and grown on the lattice mismatch-reducing layer,
    a crystal restoration layer made of $In_zGa_{1-z}N(z>0)$, grown on the electron supply layer and in contact with the active layer,
    an electron acceleration layer made of n-GaN or undoped GaN and grown on the lower contact layer, and
    a heterojunction electron barrier-removing layer made of a higher doping concentration of n-GaN than that of the electron acceleration layer and grown on the electron acceleration layer, wherein the lattice mismatch-reducing layer is grown on the heterojunction electron barrier-removing layer.

13. The III-nitride compound semiconductor light emitting device of claim 12, wherein the doping concentration of the electron acceleration layer is $1\times10^{15}$-$1\times10^{18}$ atoms/cm$^3$ when the electron acceleration layer is made of n-GaN.

14. The III-nitride compound semiconductor light emitting device of claim 12, wherein the electron acceleration layer has a thickness of 100-10000 Å.

15. The III-nitride compound semiconductor light emitting device of claim 12, wherein the doping concentration of the heterojunction electron barrier-removing layer is $1\times10^{18}$-$1\times10^{21}$ atoms/cm$^3$.

16. The III-nitride compound semiconductor light emitting device of claim 12, wherein the heterojunction electron barrier-removing layer has a thickness of 10-300 Å.

17. The III-nitride compound semiconductor light emitting device of claim 12, wherein the heterojunction electron barrier-removing layer is a delta-doping layer.

18. The III-nitride compound semiconductor light emitting device of claim 1, wherein a sequential stack of an electron acceleration layer made of n-GaN or undoped GaN and a heterojunction electron barrier-removing layer is interposed between the lower contact layer and the lattice mismatch-reducing layer, and the heterojunction electron barrier-removing layer is composed of an alternate stack in a superlattice form of a first layer made of n-GaN having a higher doping concentration than that of the electron acceleration layer and a second layer made of undoped GaN or n-GaN having a lower doping concentration than that of the first layer.

19. The III-nitride compound semiconductor light emitting device of claim 18, wherein the thickness of each of the first and second layer is 5-150 Å and the thickness of the heterojunction electron barrier-removing layer is 20-500 Å.

20. A III-nitride compound semiconductor light emitting device comprising:
   a first layer made of n-GaN and having a first doping concentration,
   an electrode in electrical contact with the first layer for supplying electrons to the first layer,
   a p-type III-nitride compound semiconductor layer,
   an active layer emitting light, being interposed between the first layer and the p-type III-nitride compound semiconductor layer and having at least one quantum well layer and one quantum barrier layer in contact with the quantum well layer,
   a lattice mismatch-reduction layer made of $In_xGa_{1-x}N$ (x>0) interposed between the first layer and the active layer and having an energy band gap larger than an energy band gap of the quantum well layer and smaller than an energy band gap of the barrier layer, and
   a second layer made of n-GaN having a second doping concentration larger than the first doping concentration for removing the heterojunction electron barrier between the first layer made of n-GaN and the lattice mismatch-reduction layer made of $In_xGa_{1-x}N(x>0)$.

21. The III-nitride compound semiconductor light emitting device of claim 20, comprising:
   a third layer made of n-GaN or undoped GaN interposed between and in contact with the first layer and the second layer and having a third doping concentration smaller the first doping concentration.

22. The III-nitride compound semiconductor light emitting device of claim 21, wherein the lattice mismatch-reduction layer is undoped.

23. The III-nitride compound semiconductor light emitting device of claim 20, wherein the second doping concentration is $1 \times 10^{18}$-$1 \times 10^{21}$ atoms/cm$^3$.

24. The III-nitride compound semiconductor light emitting device of claim 20, wherein the second layer has a thickness of 10-300 Å.

25. The III-nitride compound semiconductor light emitting device of claim 20, wherein the second layer is a delta-doping layer.

* * * * *